United States Patent
Kim et al.

(10) Patent No.: US 11,514,862 B2
(45) Date of Patent: Nov. 29, 2022

(54) METHOD FOR IMPROVING SLEW RATE OF AMPLIFIER CIRCUIT AND DISPLAY DEVICE USING THE SAME

(71) Applicant: MagnaChip Semiconductor, Ltd., Cheongju-si (KR)

(72) Inventors: Dong Ho Kim, Cheongju-si (KR); Chel Ho Chung, Sejong-si (KR); Hee Jung Kim, Cheongju-si (KR); Hyeong Sik Choi, Cheongju-si (KR)

(73) Assignee: MagnaChip Semiconductor, Ltd., Cheongju-si (KR)

( * ) Notice: Subject to any disclaimer, the term of this patent is extended or adjusted under 35 U.S.C. 154(b) by 0 days.

(21) Appl. No.: 17/381,637

(22) Filed: Jul. 21, 2021

(65) Prior Publication Data

US 2022/0122542 A1    Apr. 21, 2022

(30) Foreign Application Priority Data

Oct. 16, 2020 (KR) ........................ 10-2020-0134315

(51) Int. Cl.
*G09G 3/3266* (2016.01)
*H03F 1/02* (2006.01)
*H03F 3/45* (2006.01)

(52) U.S. Cl.
CPC ......... *G09G 3/3266* (2013.01); *H03F 1/0205* (2013.01); *G09G 2310/027* (2013.01); *G09G 2310/0291* (2013.01); *G09G 2310/066* (2013.01); *G09G 2310/08* (2013.01); *G09G 2320/0673* (2013.01); *H03F 3/45273* (2013.01); *H03F 2203/45231* (2013.01)

(58) Field of Classification Search
CPC ......... G09G 3/3266; G09G 2310/0291; G09G 2310/066; G09G 2310/08; G09G 2320/0673; H03F 1/0205; H03F 3/45273; H03F 2203/45231
See application file for complete search history.

(56) References Cited

U.S. PATENT DOCUMENTS

2004/0036670 A1* 2/2004 Chung ................. G09G 3/3688
345/99

* cited by examiner

*Primary Examiner* — Kenneth B Lee, Jr.
(74) *Attorney, Agent, or Firm* — NSIP Law

(57) ABSTRACT

A device for increasing a slew rate of a driving amplifier includes a driving amplifier, a slew rate improvement circuit, and a controller. The driving amplifier is configured to amplify an input voltage and output an output voltage. The slew rate improvement circuit is configured to provide or receive a current to increase the slew rate of the driving amplifier. The controller is configured to control an operation of the slew rate improvement circuit based on a difference between a first code corresponding to the input voltage of the driving amplifier during a current horizontal line time and a second code corresponding to the input voltage during a next horizontal line time.

23 Claims, 10 Drawing Sheets

METHOD FOR IMPROVING SLEW RATE OF AMPLIFIER CIRCUIT AND DISPLAY DEVICE USING THE SAME

CROSS-REFERENCE TO RELATED APPLICATION

The application claims the benefit under 35 USC 119(a) of Korean Patent Application No. 10-2020-0134315, filed Oct. 16, 2020, in the Korean Intellectual Property Office, the entire disclosure of which is incorporated herein by reference for all purposes.

BACKGROUND

1. Field

The following description relates to a method for improving the slew rate of an amplifier circuit and display device using the same.

2. Description of Related Art

With the larger size of a circuit in a display field, due to the increase in a load capacitance and the reduction in a horizontal period, a phenomenon occurs in which an output signal is not output immediately from a driving amplifier in response to an input signal but is output after a certain period of time.

When a large, fast-changing input signal is applied, an amplifier cannot immediately cope with the change of the input signal and generates an output signal having the maximum change rate that is changeable by the limited performance of the amplifier. A slew rate is a measure that shows how quickly the output signal can respond to the input signal and change. The slew rate is represented by a change rate of the output signal of the amplifier.

When there is a restriction on the slew rate, the output of the driving amplifier may be distorted. Therefore, the slew rate is becoming an important issue of the driving amplifier.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a device for increasing a slew rate of a driving amplifier includes a driving amplifier, a slew rate improvement circuit, and a controller. The driving amplifier is configured to amplify an input voltage and output an output voltage. The slew rate improvement circuit is configured to provide or receive a current to increase the slew rate of the driving amplifier. The controller is configured to control an operation of the slew rate improvement circuit based on a difference between a first code corresponding to the input voltage of the driving amplifier during a current horizontal line time and a second code corresponding to the input voltage during a next horizontal line time.

The controller may be further configured to set a threshold code and control the operation of the slew rate improvement circuit based on a result of a comparison of the threshold code and the difference between the first code and the second code.

The controller may be further configured to set a first threshold code with a positive value and a second threshold code with a negative value, generate a first execution command for controlling the slew rate improvement circuit to supply a current when a value obtained by subtracting the first code from the second code is greater than a value of the first threshold code, and generate a second execution command for controlling the slew rate improvement circuit to receive a current when the value obtained by subtracting the first code from the second code is less than a value of the second threshold code.

The first execution command and the second execution command may be generated before the input voltage is supplied to the driving amplifier.

The first execution command and the second execution command may operate the slew rate improvement circuit at a point of time when the input voltage of the driving amplifier is changed.

The controller may be further configured to determine time information on which the slew rate improvement circuit should operate, based on a magnitude of the value obtained by subtracting the first code from the second code, generate a first control signal for controlling the slew rate improvement circuit based on the generated first execution command and the determined time information, and generate a second control signal for controlling the slew rate improvement circuit based on the generated second execution command and the determined time information.

The slew rate improvement circuit may include a first transistor, disposed between a first power voltage and an output node of the driving amplifier, supplying a current to the output node of the driving amplifier based on the first control signal, and a second transistor, disposed between a second power voltage and the output node of the driving amplifier, receiving a current from the output node of the driving amplifier based on the second control signal.

The first transistor may be a P-type transistor and the second transistor is an N-type transistor. A source terminal of the first transistor may be connected to the first power voltage, a drain terminal of the first transistor may be connected to the output node of the driving amplifier, and a gate terminal of the first transistor may receive the first control signal. A source terminal of the second transistor may be connected to the second power voltage, a drain terminal of the second transistor may be connected to the output node of the driving amplifier, and a gate terminal of the second transistor may receive the second control signal.

The slew rate improvement circuit may further include a plurality of third transistors configured to allow a portion of the current to flow out from the inside of the driving amplifier to the second power voltage when the first transistor is turned on based on the first control signal, and a plurality of fourth transistors configured to supply a current internally to the driving amplifier from the first power voltage when the second transistor is turned on based on the second control signal.

In another general aspect, a display device includes a gate driver, a source driver, a display panel, and a timing controller. The gate driver is configured to sequentially provide a gate-on signal to a plurality of gate lines in response to a gate control signal. The source driver is configured to, in response to a data control signal, convert digital image data into analog image signals and provide the converted image signals to a plurality of data lines. The display panel includes a plurality of sub-pixels provided at intersections of the plurality of gate lines and the plurality of data lines. The timing controller is configured to externally receive a video image data, generate the digital image data, provide the generated digital image data to the source driver, and generate the gate control signal and the data control signal. The source driver includes a data latch configured to latch the digital image data received from the timing controller, a digital-to-analog converter (DAC) configured to convert the latched digital image data to an analog signal, and a driving amplifier configured to amplify the analog signal outputted from the DAC and provide the amplified analog signal to the plurality of data lines. The driving amplifier includes a slew rate improvement circuit configured to increase a slew rate based on the digital image data corresponding to the analog signal displayed on the plurality of sub-pixels during a horizontal line time.

The source driver may further include a controller configured to set a threshold code value and control an operation of the slew rate improvement circuit based on a result of a comparison of the threshold code value with a difference value between a first code of the digital image data corresponding to an input voltage of the driving amplifier, during a current horizontal line time, and a second code that is the digital image data corresponding to an input voltage of the driving amplifier, during a next horizontal line time.

The timing controller may further include a controller configured to set a threshold code value and control an operation of the slew rate improvement circuit based on a result of a comparison of the threshold code value with a difference value between a first code of the digital image data corresponding to an input voltage of the driving amplifier, during a current horizontal line time, and a second code of the digital image data corresponding to an input voltage of the driving amplifier, during the next horizontal line time.

The controller may be further configured to set a first threshold code with a positive value and a second threshold code with a negative value, generate a first execution command to control the slew rate improvement circuit to supply a current when a value obtained by subtracting the first code from the second code is greater than a value of the first threshold code, and generate a second execution command to control the slew rate improvement circuit to receive a current when the value obtained by subtracting the first code from the second code is less than a value of the second threshold code.

The controller may be further configured to generate the first execution command and the second execution command before the input voltage of the driving amplifier is supplied to the driving amplifier.

The first execution command and the second execution command may operate the slew rate improvement circuit at a point of time when an input voltage of the driving amplifier is changed.

The controller may be further configured to determine time information on which the slew rate improvement circuit should operate, based on a magnitude of the value obtained by subtracting the first code from the second code, generate a first control signal for controlling the slew rate improvement circuit based on the generated first execution command and the determined time information, and generate a second control signal for controlling the slew rate improvement circuit based on the generated second execution command and the determined time information.

The controller may be further configured to set a first threshold code with a positive value and a second threshold code with a negative value, generate a first execution command to control the slew rate improvement circuit to supply a current when a value obtained by subtracting the first code from the second code is greater than a value of the first threshold code, and generate a second execution command to control the slew rate improvement circuit to receive a current when the value obtained by subtracting the first code from the second code is less than a value of the second threshold code.

The controller may be further configured to generate the first execution command and the second execution command before the input voltage of the driving amplifier is supplied to the driving amplifier.

The first execution command and the second execution command may operate the slew rate improvement circuit at a point of time when an input voltage of the driving amplifier is changed.

The controller may be further configured to determine time information on which the slew rate improvement circuit should operate, based on a magnitude of the value obtained by subtracting the first code from the second code, generate a first control signal for controlling the slew rate improvement circuit based on the generated first execution command and the determined time information, and generate a second control signal for controlling the slew rate improvement circuit based on the generated second execution command and the determined time information.

In another general aspect, a method for increasing a slew rate of a driving amplifier, the method includes setting a threshold code, obtaining a first code of a digital image data corresponding to an input voltage of the driving amplifier, during a current horizontal line time, and a second code of a digital image data corresponding to an input voltage of the driving amplifier, during a next horizontal line time, generating a slew rate improvement circuit execution command based on a result of a comparison between a value of the threshold code and a difference between a value of the second code and a value of the first code, generating information required for an operation of the slew rate improvement circuit in response to the generated execution command, and generating a control signal to operate the slew rate improvement circuit based on the generated information.

The setting of the threshold code may include setting a first threshold code with a positive value, and setting a second threshold code with a negative value. The generating of the slew rate improvement circuit execution command may include generating a first execution command when a value obtained by subtracting the first code from the second code is greater than the first threshold code, and generating a second execution command when a value obtained by subtracting the first code from the second code is less than the second threshold code.

The generating of the information required for the operation of the slew rate improvement circuit may include determining time information on which the slew rate improvement circuit should operate, based on a magnitude of the value obtained by subtracting the first code from the second code.

The generating of the control signal to operate the slew rate improvement circuit based on the generated information may include generating a first control signal for controlling the slew rate improvement circuit to supply a current to an output terminal of the driving amplifier, based on the generated first execution command and the determined time information, and generating a second control signal for controlling the slew rate improvement circuit to receive a current from the output terminal of the driving amplifier, based on the generated second execution command and the determined time information.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
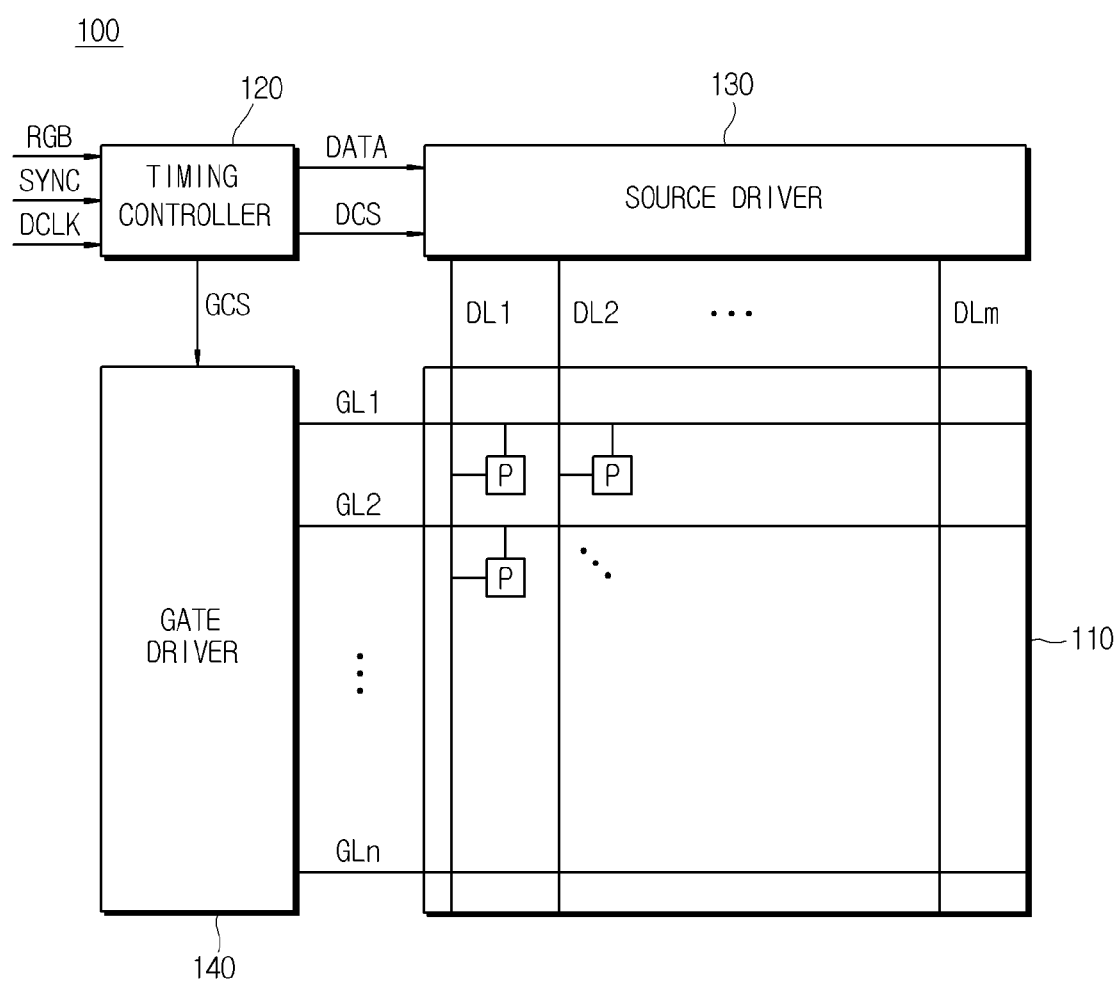
FIG. 1 is a view showing a display device conceptually according to various embodiments.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

A suffix "module" or "part" for the component, which is used in the following description, is given or mixed in consideration of only convenience for ease of specification, and does not have any distinguishing meaning or function per se. Also, the "module" or "part" may mean software components or hardware components such as a field programmable gate array (FPGA), an application specific integrated circuit (ASIC). The "part" or "module" performs certain functions. However, the "part" or "module" is not meant to be limited to software or hardware. The "part" or "module" may be configured to be placed in an addressable storage medium or to restore one or more processors. Thus, for one example, the "part" or "module" may include components such as software components, object-oriented software components, class components, and task components, and may include processes, functions, attributes, procedures, subroutines, segments of a program code, drivers, firmware, microcode, circuits, data, databases, data structures, tables, arrays, and variables. Components and functions provided in the "part" or "module" may be combined with a smaller number of components and "parts" or "modules" or may be further divided into additional components and "parts" or "modules".

The operations of a method or algorithm described in connection with some embodiments of the present disclosure may be embodied directly in hardware module, software module, or a combination thereof, executed by a processor. The software module may reside in RAM memory, flash memory, ROM memory, EPROM memory, EEPROM memory, registers, hard disk, removable disk, CD-ROM, or any other type of recording medium known in the art. An exemplary recording medium is coupled to the processor, which can read information from and write information to the storage medium. In the alternative, the recording medium may be integral to the processor. The processor and the recording medium may reside in an application specific integrated circuit (ASIC). The ASIC may reside in a user terminal.

Various embodiments of the present disclosure relate to a method for improving a slew rate and more particularly to a method for improving a slew rate in a source driving amplifier of a display and a device implementing the same.

The device and method proposed in the present disclosure allow operation determination factors of the slew rate improvement circuit to be determined by a digital threshold code irrespective of physical changes of circuit operation, so that more accurate operation of the slew rate improvement circuit can be performed.

The device and method proposed in the present disclosure allow a value of the digital threshold code, which is an operation condition of the slew rate improvement circuit, to be freely selected within a range of design, thereby causing prerequisites for the operation to be variable.

The device and method proposed in the present disclosure allow an operation time of the slew rate improvement circuit to be randomly determined.

The device and method proposed in the present disclosure can operate the slew rate improvement circuit at the same time when an input signal is applied to an input terminal of the driving amplifier.

Advantageous effects that can be obtained from the present disclosure are not limited to the above-mentioned effects. Further, other unmentioned effects can be clearly understood from the following descriptions by those skilled in the art to which the present disclosure belongs.

FIG. 1 is a view showing a display device conceptually according to various embodiments.

Referring to FIG. 1, the display device 100 may include a display panel 110, a timing controller 120, a source driver 130, and a gate driver 140.

According to the embodiments, the display device 100 may display images or videos. For example, the display device 100 may mean a device capable of displaying images or video on a smartphone, a tablet personal computer (PC), a computer, a camera, or wearable devices, etc., and is not limited thereto.

The display panel 110 may include a plurality of sub-pixels P, which are arranged in rows and in columns. For example, the display panel 110 may be implemented with one of liquid crystal display (LCD), light emitting diode (LED) display, organic light emitting diode (OLED) display, active-matrix OLED (AMOLED) display, Electrochromic Display (ECD), Digital Mirror Device (DMD), Actuated Mirror Device (AMD), Grating Light Valve (GLV), Plasma Display Panel (PDP), Electro Luminescent Display (ELD), and Vacuum Fluorescent Display (VFD), and is not limited thereto.

The display panel 110 may include a plurality of gate lines (GL1 to GLn, n is a natural number) which are arranged in rows, a plurality of data lines (DL1 to DLm, m is a natural number) which are arranged in columns, and sub-pixels P formed at intersections of the plurality of gate lines GL1 to GLn and the plurality of data lines DL1 to DLm. The display panel 110 includes a plurality of horizontal lines. One horizontal line is composed of the sub-pixels P connected to one gate line. During one horizontal time H, the sub-pixels arranged in one horizontal line are driven. During the next one horizontal time (1H), the sub-pixels arranged in another horizontal line may be driven.

The sub-pixels P may include a light-emitting diode (LED) and a diode driving circuit that drives the light-emitting diode independently. The diode driving circuit may be connected to one gate line and one data line, and the light-emitting diode may be connected between the light-emitting device driving circuit and a power voltage (for example, a ground voltage).

The diode driving circuit may include a switching device connected to the gate lines GL1 to GLn, for example, a thin film transistor (TFT). When a gate-on signal is applied from the gate lines GL1 to GLn and the switching element is turned on, the diode driving circuit may provide the light-emitting diode with an image signal (or referred to as a pixel signal) received from the data lines DL1 to DLm connected to the diode driving circuit. The light-emitting diode may output an optical signal corresponding to an image signal.

Each of the sub-pixels P may be one of a red element R which outputs red light, a green element G which outputs green light, and a blue element B which outputs blue light. In the display panel 110, the red element, the green element, and the blue element may be arranged in various ways. According to the embodiments, the sub-pixels P of the display panel 110 may be arranged repeatedly in the order of R, G, B, G or B, G, R, G, etc. For example, the sub-pixels P of the display panel 110 may be arranged according to an RGB stripe structure and an RGB Pentile structure, without being limited thereto.

The gate driver 140 may sequentially provide the gate-on signal to the plurality of gate lines GL1 to GLn in response to a gate control signal GCS. For example, the gate control signal GCS may include a gate start pulse which instructs the start of the gate-on signal output, a gate shift clock that controls a gate-on signal output time point, and the like.

When the gate start pulse is applied, the gate driver 140 may generate the gate-on signal (e.g., logic high gate voltage) sequentially in response to the gate shift clock and may provide the gate-on signal to the plurality of gate lines (GL1 to GLn) sequentially. Here, during a time period in which the gate-on signal is not provided to the plurality of gate lines (GL1 to GLn), a gate-off signal (e.g., logic low gate voltage) is provided to the plurality of gate lines (GL1 to GLn).

The source driver 130 may convert digital image data DATA into analog image signals in response to a data control signal DCS and may provide the converted image signals to the plurality of data lines (DL1 to DLm). The source driver 130 may provide the image signals corresponding to one horizontal line to the plurality of data lines (DL1 to DLm) during one horizontal time (1H).

The source driver 130 may include a driving amplifier 135, which transmits a signal to the data lines (DL1 to DLm).

The driving amplifier 135 may transmit the signals to the display panel 110. The source driver 130 may convert the digital image data DATA into the image signals in response to the data control signal DCS. The source driver 130 may convert the digital image data DATA into the image signals with gradation voltages corresponding to the digital image data DATA and may output the converted image signals to the plurality of data lines (DL1 to DLm) through the driving amplifier 135.

The timing controller 120 may receive a video image data RGB from the outside, may perform image processing on the video image data RGB or convert the video image data RGB to fit the structure of the display panel 110, and then may generate the digital image data DATA. The timing controller 120 may transmit the digital image data DATA to the source driver 130.

The timing controller 120 may receive a plurality of control signals from an external host device. The control signals may include a horizontal synchronization signal Hsync, a vertical synchronization signal Vsync, and a clock signal DCLK.

The timing controller 120 may generate the gate control signal GCS and the data control signal DCS for controlling the gate driver 140 and the source driver 130 based on the received control signals. The timing controller 120 may control various operation timings of the gate driver 140 and the source driver 130 based on the gate control signal GCS and the data control signal DCS.

According to the embodiments, the timing controller 120 may control the gate driver 140 based on the gate control signal GCS such that the gate driver 140 drives the plurality of gate lines (GL1 to GLn). The timing controller 120 may control the source driver 130 based on the data control signal DCS such that the source driver 130 provides the image signals to the plurality of plurality of data lines (DL1 to DLm).

Although the timing controller 120, the source driver 130, and the gate driver 140 are shown as separate modules in the embodiment of FIG. 1, it should be understood that they can be manufactured by being integrated into one display driver IC.

Figure 2:
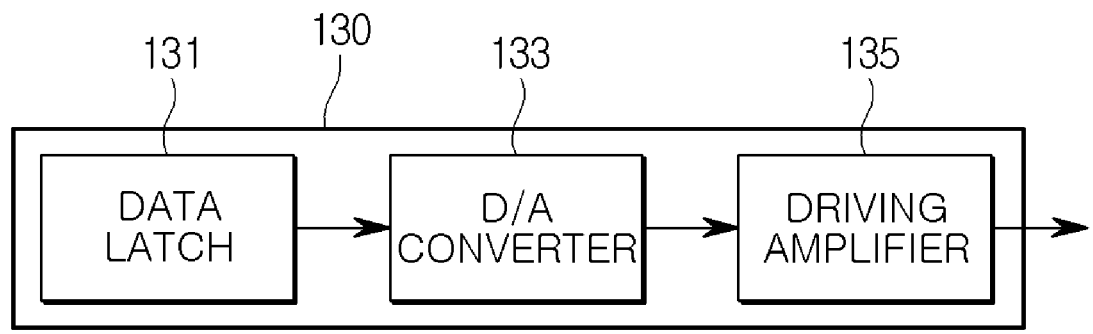
FIG. 2 is a block diagram showing a source driver 130 according to various embodiments.

FIG. 2 is a block diagram showing the source driver 130 according to various embodiments.

The block diagram of FIG. 2 shows only parts related to the present disclosure, and other blocks not shown in FIG. 2 may be included.

Referring to FIG. 2, the source driver 130 may include a data latch 131, a digital to analog (D/A) converter 133, and the driving amplifier 135. The size of the data latch 131, the number of D/A converters 133, and the number of driving amplifiers 135 may be changed according to the number of data lines DL1 to DLm to be driven. In one embodiment, when the display panel 110 has an RGB structure and supports a Full HD resolution, 1,080 sub-pixel circuits for three R, G, and B are arranged. Therefore, it may be desired for the source driver 130 to drive a total of 3,240 data lines DL1 to DLm. In addition, the source driver 130 may receive, from the timing controller 120, digital image data required to drive the total of 3,240 data lines DL1 to DLm. The digital image data may include sub-pixel data for sub-pixels driven during each horizontal line time.

The data latch 131 may receive the sub-pixel data from the timing controller 120 every one horizontal time (1H) and temporarily store it. In the embodiment, the data latch 131 may store the sub-pixel data during a current horizontal line time and the sub-pixel data during the next horizontal line time at the same time. In the embodiment, the data latch 131 may include a latch for storing the sub-pixel data during a current horizontal line time and a latch for temporarily storing the sub-pixel data during the next horizontal line time. In the embodiment, the data latch 131 may receive and store the sub-pixel data for the next horizontal line time from the timing controller 120 before the start point of the next horizontal line time by a certain amount of time.

The D/A converter 133 may convert the sub-pixel data temporarily stored in the data latch 131 in a digital format into an analog form and provide an analog input signal to the driving amplifier 135. In the embodiment, the D/A converter 133 may further include a gamma correction circuit such that an analog drive signal subjected to gamma correction for compensating for a nonlinear response characteristic of human vision to light is provided.

The driving amplifier 135 may buffer and amplify the input signal provided from the D/A converter 133 and may output an output signal. The output signal may be a drive signal which is applied to the data lines DL1 to DLm.

Here, due to a slew rate of the driving amplifier 135, the output signal may not immediately respond according to the input signal and may be distorted and output. In order to prevent the distortion of the output signal, it may be desired to increase the slew rate of the driving amplifier 135.

Figure 3:
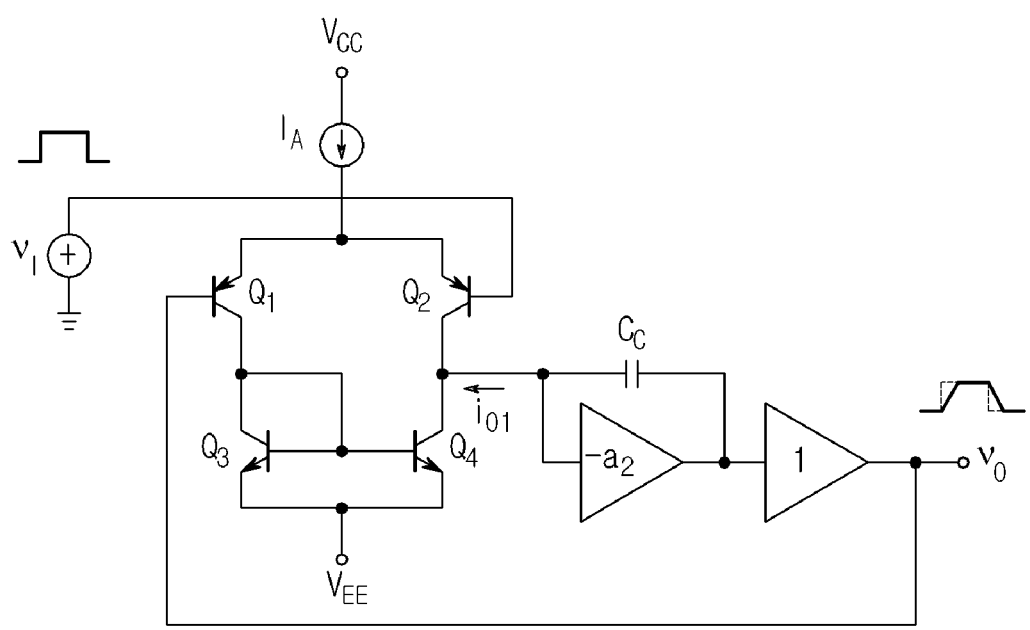
FIG. 3 shows a structure of a typical amplifier.

FIG. 3 shows a structure of a typical amplifier.

Referring to FIG. 3, according to the embodiment, the slew rate of the driving amplifier is increased by temporarily increasing a current $I_A$ or by temporarily decreasing a frequency compensation capacitor $C_c$.

Figure 4:
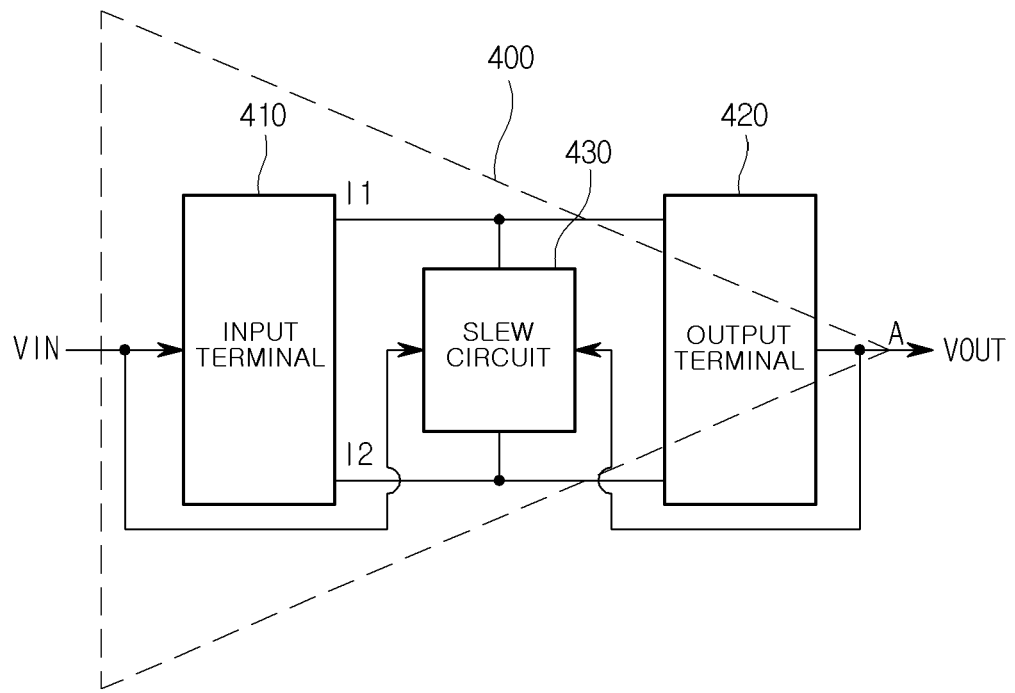
FIG. 4 shows a structure of a typical amplifier according to another embodiment and shows a driving amplifier, including a slew circuit for increasing a slew rate of the driving amplifier.

FIG. 4 shows a structure of a typical amplifier according to another embodiment and shows the driving amplifier, including a slew circuit for increasing a slew rate of the driving amplifier.

Referring to FIG. 4, a typical amplifier 400 includes an input terminal 410 and an output terminal 420, and may additionally include a slew circuit 430 so as to increase the slew rate. The slew circuit 430 may automatically control the slew rate in accordance with a difference between the size of the input signal and the size of the output signal. The slew circuit 430 can obtain an operating margin by shortening a pull-up or pull-down time without an increase in the bias current $I_A$ or a decrease in the compensation capacitor $C_c$.

In the example of FIG. 4, the slew circuit 430 can increase the slew rate by allowing the current I1 to pull-in to VOUT when VIN is greater than VOUT and by allowing current I2 to pull-down from VOUT when VIN is less than VOUT.

The operation of a slew rate improvement circuit shown in FIG. 4 is determined by a difference between the input voltage and the output voltage, that is, VIN−VOUT. According to the embodiment, when VIN−VOUT is greater than a threshold voltage VTH of an NMOS transistor, the current may flow out to the output. Here, the magnitude I of the current flowing to the output is determined by $I=K(VIN-VOUT-VTH)^2$. Therefore, the magnitude I of the current is determined by the difference of VIN−VOUT. Since VIN−VOUT gradually decreases by the operation of a current source for improving the slew rate, a time for supplying current by satisfying the condition that VIN-VOUT is greater than VTH becomes inversely proportional to a current operational performance.

As shown in FIG. 4, the slew circuit that attempts to improve the slew rate by using the difference between the input voltage and the output voltage may have several problems.

For example, all source driving amplifiers within the display may not have consistent prerequisites for operation. In order to determine the operation of the slew circuit, there must be a transistor that compares the input voltage VIN and the output voltage VOUT. When the difference between the input voltage and the output voltage is greater than the threshold voltage VTH of the transistor, the circuit operates. However, since the threshold voltage of the transistor has a value that changes according to an ambient temperature during the manufacturing process and operations thereof and is difficult to maintain constant, the threshold voltages of all source driving amplifiers within the display may be different from each other, so that the source driving amplifiers cannot have the consistency of prerequisites for operation. This inconsistency problem may further occur between displays.

Also, the threshold voltage of the transistor, which compares the input voltage and the output voltage, has a value fixed by the physical properties of the transistor, and it is difficult for a user to select a random value as the threshold voltage, making it difficult to change the prerequisites for starting the operations of the slew circuit.

Also, the operation of the transistor, which compares the input voltage and the output voltage, lasts only during a time period during which the input voltage-output voltage-threshold voltage (VIN−VOUT−VTH) is greater than 0. It is difficult for the user to randomly determine this operation time or to change this operation time from a first value to a second value.

Also, the comparison operation and the current supply operation are performed in real-time. Therefore, if the comparison operation is delayed, the current supply may also be delayed.

As described above, the typical amplifier, according to a prior art shown in FIG. 4, may compare the difference between the input voltage and the output voltage and determine whether the slew circuit operates, and may have an input offset by a physical value such as a manufacturing process distribution, so that the threshold voltage that is a reference value may change. In order to solve this problem, the present disclosure uses a difference in code value, that is, a logical value rather than the above physical value, as a criterion for determining whether the slew rate improvement circuit operates. The corresponding code value can be maintained regardless of physical changes such as a manufacturing process distribution, temperature, etc. Here, the code may be the sub-pixel data that is provided to the source driver 130 by the timing controller 120. Also, the code value may be a gradation value obtained by converting the sub-pixel data (e.g., 10-bit data) represented by a series of binary numbers into a decimal value. For example, if the code is "0000000000", the code value may be 0, and if the code is "1000000000", the code value may be 512.

Figure 5:
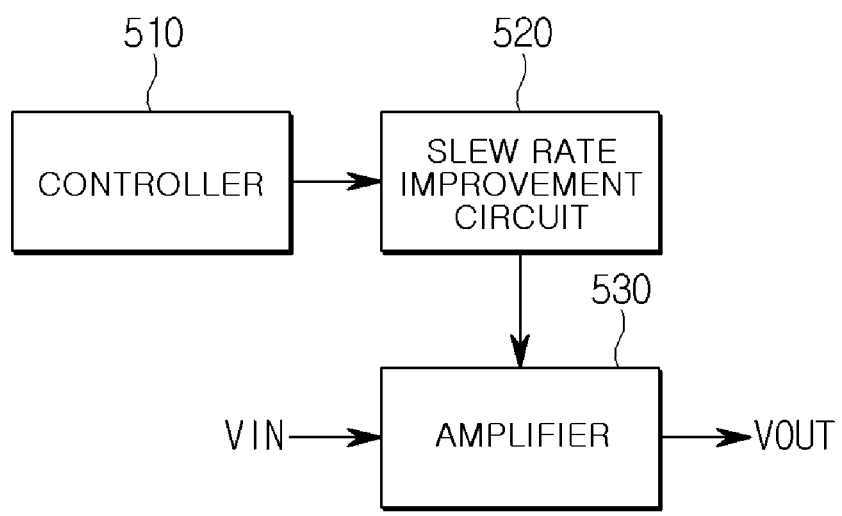
FIG. 5 is a block diagram showing a method for improving the slew rate of the amplifier based on a code value corresponding to an input voltage, according to various embodiments.

FIG. 5 is a block diagram showing a method for improving the slew rate of the amplifier based on a code value corresponding to the input voltage, according to various embodiments.

Referring to FIG. 5, the driving amplifier 135 may include a slew rate improvement circuit 520 and an amplifier 530. The amplifier 530 is a typical operational amplifier and may receive and amplify the input voltage VIN, and may output the output voltage VOUT. A typical input voltage VIN and a typical output voltage VOUT used in the display may range from 3.5 V to 6.5 V.

The slew rate improvement circuit 520 may provide the driving amplifier 135 with slew rate improvement that cannot be achieved only by the amplifier 530. The slew rate improvement circuit 520 can improve the slew rate of the driving amplifier 135 by further adding an additional current to an output node or by allowing the current to flow out more quickly from the output node.

A controller 510 may control the operation of the slew rate improvement circuit 520. According to the embodiment, the controller 510 finds a point of time when the slew rate is required to increase and operates the slew rate improvement circuit 520, thereby improving the slew rate of the driving amplifier 135.

The controller 510 may operate the slew rate improvement circuit 520 based on a code value corresponding to the input voltage, which is input to each driving amplifier 135. Here, the code value corresponding to the input voltage may be pixel data provided to the source driver 130 by the timing controller 120. The pixel data provided to the source driver 130 by the timing controller 120 is represented by a 10-bit or 16-bit code. The pixel data may be latched in the data latch 131 in the source driver 130 and converted into an analog voltage by the D/A converter 133 and input as an input voltage of the driving amplifier 135. Accordingly, the controller 510 may use the pixel data provided by the timing controller 120 as it is, without the need to convert the input voltage VIN of the driving amplifier 135 into a code. According to the embodiment, the controller 510 may be provided as a separate processor within the source driver 130. Also, according to another embodiment, the timing controller 120 may perform a function of the controller 510 because the timing controller 120 is aware of the code value corresponding to the input voltage, which is input to each driving amplifier 135.

Figure 6:
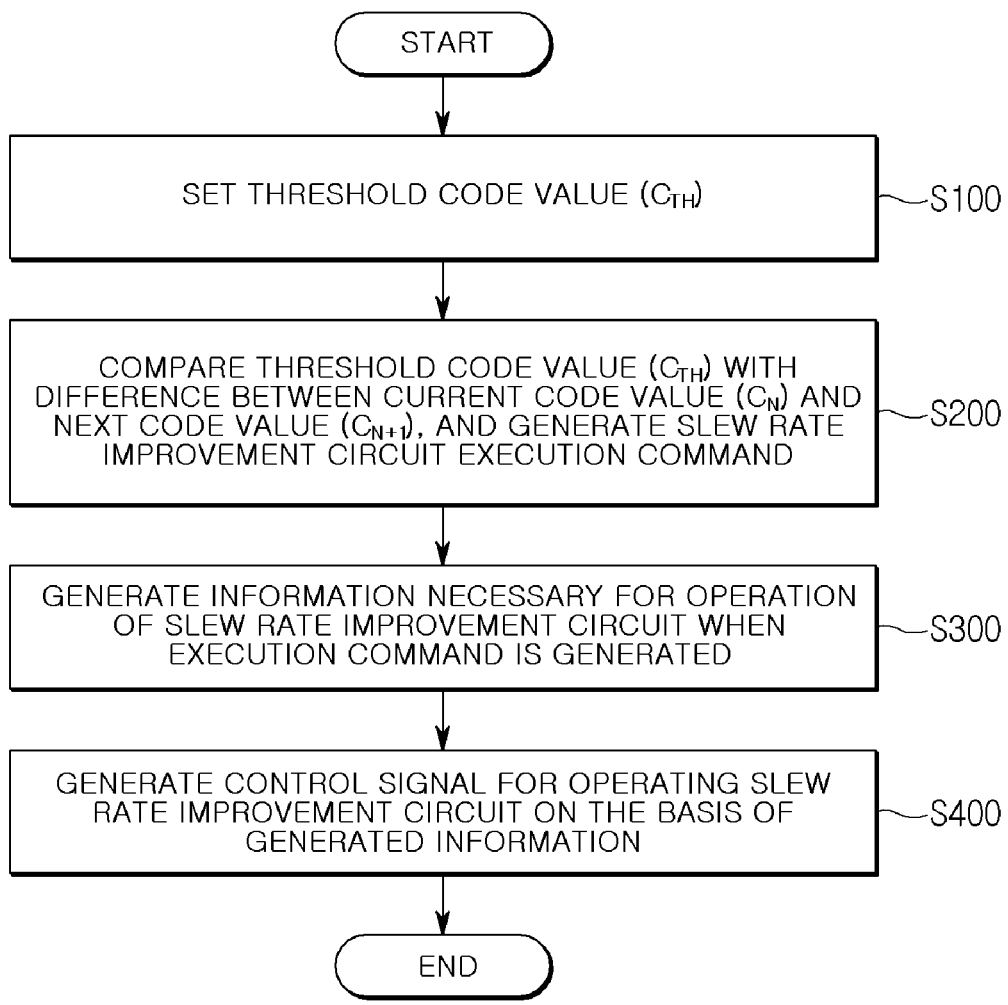
FIG. 6 is a flowchart showing a control method of a controller 510 for improving the slew rate of the amplifier based on the code value corresponding to the input voltage.

FIG. 6 is a flowchart showing a control method of the controller 510 for improving the slew rate of the amplifier based on the code value corresponding to the input voltage.

Referring to FIG. 6, in operation S100, the controller 510 may set a threshold code value $C_{TH}$. According to the embodiment, the threshold code value $C_{TH}$ may be a value corresponding to a threshold voltage VTH of a comparator transistor. The threshold code value $C_{TH}$ may be set to the same value for all driving amplifiers within the display, or may be set to different values according to the situation of each driving amplifier. Unlike a conventional method, the controller 510 can freely select and change the threshold code value $C_{TH}$ within a design range. Also, the controller 510 may change the threshold code value $C_{TH}$ in real-time.

According to the embodiment, the controller 510 may set two threshold code values $C_{TH}$. For example, a first threshold code value may be a positive threshold code value, and a second threshold code value may be a negative threshold code value. According to the embodiment, the sizes of the first threshold code value and the second threshold code value may be the same. Also, according to another embodiment, the sizes of the first threshold code value and the second threshold code value may be different from each other.

In operation S200, the controller 510 may compare the threshold code value $C_{TH}$ and a difference $C_{N+1}-C_N$ between a code value $C_N$ corresponding to the input voltage of the driving amplifier 135 during a current horizontal line time and a code value $C_{N+1}$ corresponding to the input voltage of the driving amplifier 135 during the next horizontal line time, may determine whether to execute the slew rate improvement circuit 520, and may generate an execution command.

The controller 510 may determine whether the code value difference $C_{N+1}-C_N$ is greater than a first positive threshold code value. If the code value difference $C_{N+1}-C_N$ is greater than the first threshold code value, a first execution command may be generated. The first execution command may be a command for operating the slew rate improvement circuit 520 to supply the current to the output of the amplifier 530.

The controller 510 may determine whether the code value difference $C_{N+1}-C_N$ is less than a second negative threshold code value. If the code value difference $C_{N+1}-C_N$ is less than the second threshold code value, the second execution command may be generated. The second execution command may be a command for operating the slew rate improvement circuit 520 to receive (sink) the current from the output of the amplifier 530.

In operation S300, when the first execution command or the second execution command is generated, the controller 510 may generate the information necessary for the operation of the slew rate improvement circuit 520. The information may be time information indicating a time interval in which the slew rate improvement circuit 520 should operate, or voltage information or current information. According to the embodiment, the controller 510 may determine the information necessary for the operation of the slew rate improvement circuit 520 in proportion to the size of the code value difference $C_{N+1}-C_N$.

In operation S400, the controller 510 may generate a control signal for operating the slew rate improvement circuit 520 based on the information determined in operation S300. According to the embodiment, the control signal may be a first control signal corresponding to the first execution command and a second control signal corresponding to the second execution command. The first control signal may control the supply of an additional current to the output of the amplifier 530 by the slew rate improvement circuit 520. The second control signal may control the additional reception of the current from the output of the amplifier 530 by the slew rate improvement circuit 520. The controller 510 may generate the first control signal or the second control signal such that the slew rate improvement circuit 520 operates only during the time interval determined in operation S300.

Figure 7:
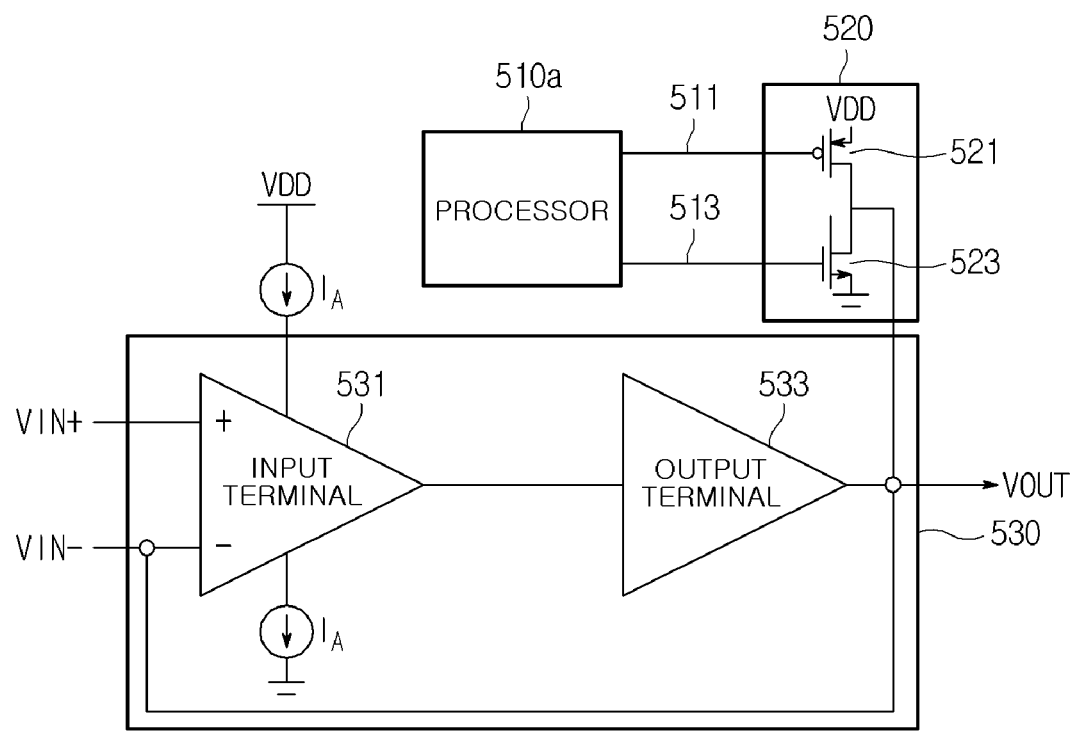
FIG. 7 is a simplified circuit diagram showing the method for improving the slew rate of the amplifier based on the code value corresponding to the input voltage, according to various embodiments.

FIG. 7 is a simplified circuit diagram showing the method for improving the slew rate of the amplifier based on the code value corresponding to the input voltage, according to various embodiments.

Referring to FIG. 7, the controller 510 may be implemented by a processor 510a. The processor may be any component capable of implementing and executing the functions shown in FIG. 6, including a general-purpose processor, FPGA, CPLD, and ASIC. Alternatively, the processor 510a may be the timing controller 120.

The amplifier 530 has a structure that may include an input terminal 531 and an output terminal 533. The input terminal 531 outputs a signal by receiving a differential signal as an input, and the output terminal 533 may function as a buffer. Here, the output of the output terminal 533 is connected to the (-) terminal input of the input terminal 531, that is, the (-) terminal of the differential signal, so that the output signal of the output terminal 533 follows the input signal of the input terminal 531. Here, the slew rate of the amplifier 530 is determined by the slew rate of the amplifier of the input terminal 531 and the output terminal 533, and accordingly, the output signal VOUT of the output terminal 533 may take time to follow the input signal VIN of the input terminal 531.

The processor 510a may generate the first control signal 511 or the second control signal 513, in accordance with the method shown in FIG. 6, and may control the operation of the slew rate improvement circuit 520.

As shown in FIG. 7, the slew rate improvement circuit 520 may include a first transistor 521 and a second transistor 523. The first transistor 521 may be a P-type transistor, and the second transistor 523 may be an N-type transistor.

The first control signal 511 may be connected to the gate of the first transistor 521 and may control on/off the first transistor 521. According to the embodiment, in a case where the first transistor 521 is a P-type transistor, when the first control signal 511 has a low (near 0 V) value, for example, the first transistor 521 can be turned on, and when the first control signal 511 has a high (near VDD) value, for example, the first transistor 521 can be turned off. Accordingly, the first control signal 511 may have a low value only during a time interval in which the first transistor 521 is to be turned on and may have a high value in a time period in which the first transistor 521 is to be turned off.

The second control signal 513 may be connected to the gate of the second transistor 523 and may control on/off the second transistor 523. According to the embodiment, in a case where the second transistor 523 is an N-type transistor, when the second control signal 513 has a high (near VDD) value, the second transistor 523 can be turned on, and when the second control signal 513 has a low (near 0 V) value, the second transistor 523 can be turned off. Accordingly, the second control signal 513 may have a high value only during a time interval in which the second transistor 523 is to be turned on and may have a low value in a time period in which the second transistor 523 is to be turned off.

When the first transistor 521 is turned on by the first control signal 511, a current may be supplied from VDD to the output node of the amplifier 530 through a source and a drain. Also, when the second transistor 523 is turned on by the second control signal 513, a current may flow from the output node to the GND through the source and the drain. Accordingly, the slew rate improvement circuit 520 supplies an additional current based on the first control signal 511 or forms an additional current sink based on the second control signal 513, thereby improving the slew rate of the driving amplifier 135.

Figure 8:
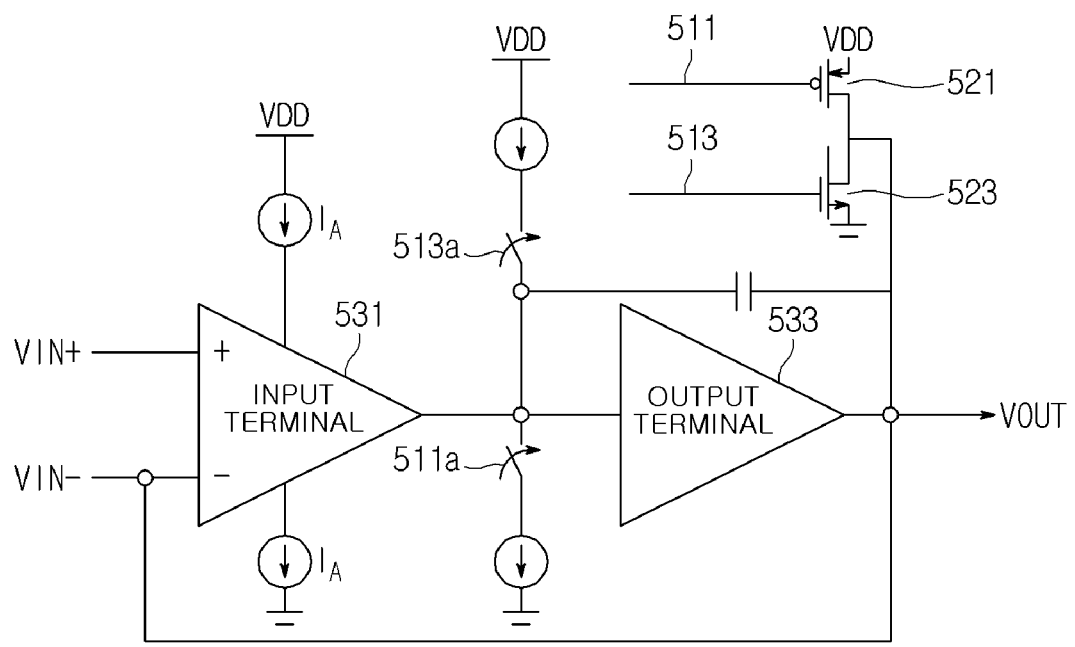
FIG. 8 is a simplified circuit diagram showing the method for improving the slew rate of the amplifier based on the code value corresponding to the input voltage, according to various embodiments.

FIG. 8 is a simplified circuit diagram showing the method for improving the slew rate of the amplifier based on the code value corresponding to the input voltage, according to various embodiments.

In the circuit diagram of FIG. 8, when the current supply/sinking operation of the slew rate improvement circuit 520 in the circuit diagram of FIG. 7 is performed, a second switch 513a is turned on in conjunction with the second control signal 513, a first switch 511a is turned on in conjunction with the first control signal 511, so that a current mirrored constant current is supplied to a cascode folding node of the input terminal 531. Therefore, a faster up and down motion effect can be produced at the output terminal 533.

Figure 9:
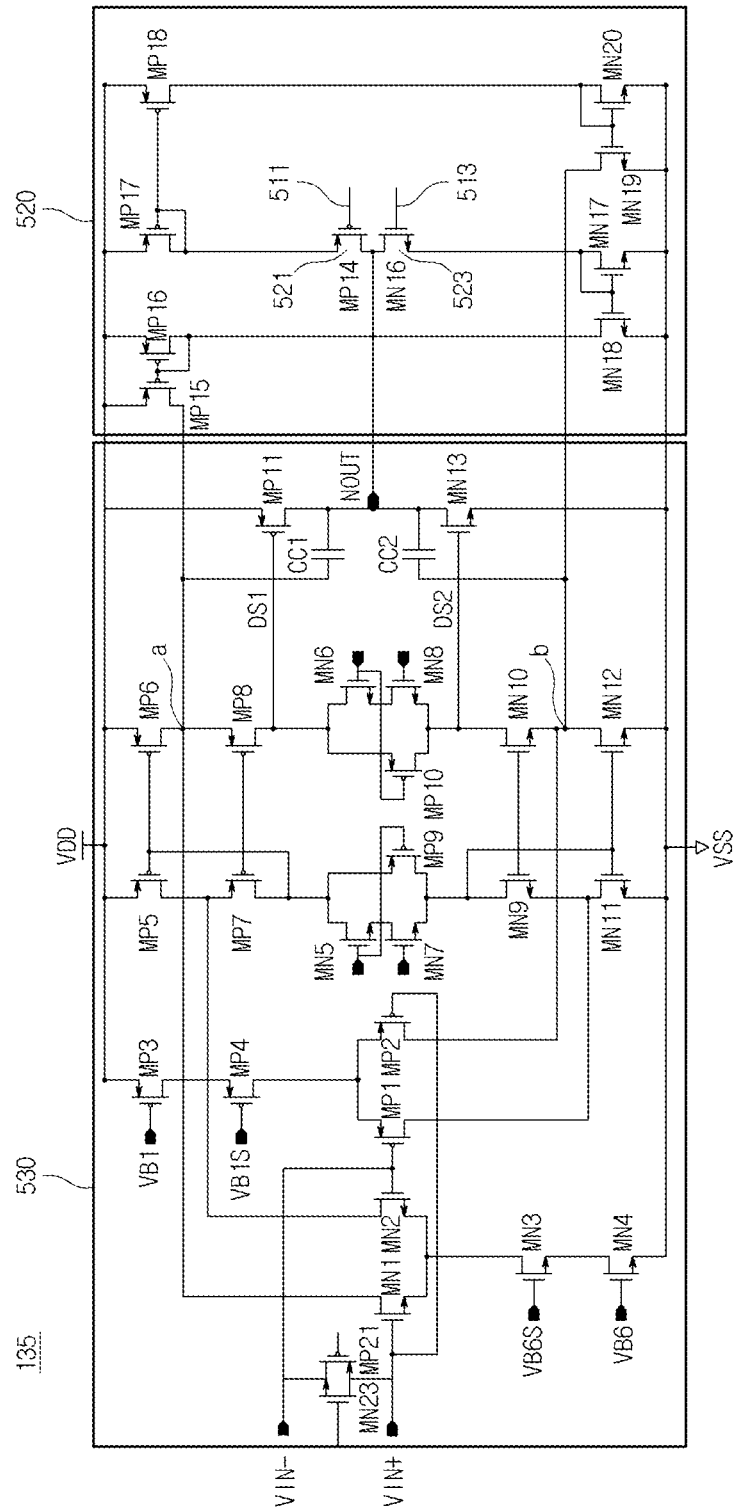
FIG. 9 is a circuit diagram of the driving amplifier 135, which implements the method for improving the slew rate of the amplifier based on the code value corresponding to the input voltage.

FIG. 9 is a circuit diagram of the driving amplifier 135, which implements the method for improving the slew rate of the amplifier based on the code value corresponding to the input voltage. FIG. 9 may be a circuit diagram showing an actually implemented circuit of the simplified circuit diagram of FIG. 8.

Referring to FIG. 9, each component of the driving amplifier 135 may be connected to power sources VDD and VSS through power lines. Here, a first power voltage VDD may be greater than a second power voltage VSS.

The output terminal 533 of the amplifier 530 may include two driving transistors MP11 and MN13. According to embodiments, the first driving transistor MP11 may be provided between the first power voltage VDD and an output node NOUT, and the second driving transistor MN13 may be provided between the output node NOUT and the second power voltage VSS. According to the embodiment, the first driving transistor MP11 may be a P-type transistor, and the second driving transistor MN13 may be an N-type transistor. In this case, a gate of the first driving transistor MP11 may be connected to the input terminal 531, a source of the first driving transistor MP11 may be connected to the first power voltage VDD, and a drain of the first driving transistor MP11 may be connected to the output node NOUT. Also, a gate of the second driving transistor MN13 may be connected to the input terminal 531, a source of the second driving transistor MN13 may be connected to the second power voltage VSS, and a drain of the second driving transistor MN13 may be connected to the output node NOUT.

The first driving transistor MP11 may be turned on and operated in response to a first drive signal DS1 transmitted from the input terminal 531, and the second driving transistor MN13 may be turned on and operated in response to a second drive signal DS2 transmitted from the input terminal 531. According to embodiments, the first driving transistor MP11 may perform a pull-up operation, and the second driving transistor MN13 may perform a pull-down operation.

The first driving transistor MP11 and the second driving transistor MN13 may operate complementarily. For example, when the first driving transistor MP11 is turned on, the second driving transistor MN13 may be turned off. Conversely, when the second driving transistor MN13 is turned on, the first driving transistor MP11 may be turned off.

According to various embodiments, the slew rate improvement circuit 520 may include the two transistors 521 and 523 for supplying a current to the output node NOUT or receiving a current from the output node NOUT. The first transistor 521 may be a P-type transistor and may be provided between the first power voltage VDD and the output node NOUT, and the second transistor 523 may be an N-type transistor and may be provided between the output node NOUT and the second power voltage VSS. The output of the slew rate improvement circuit 520 is a node to which a drain of the first transistor 521 and a drain of the second transistor 523 are connected, and the output of the slew rate improvement circuit 520 may also be connected to the output node NOUT.

A gate of the first transistor 521 may be connected to the controller 510 and may receive the first control signal 511, a source of the first transistor 521 may be connected to the first power voltage VDD, and a drain of the first transistor 521 may be connected to the output node NOUT. A gate of the second transistor 523 may be connected to the controller 510 and may receive the second control signal 513, a source of the second transistor 523 may be connected to the second power voltage VSS, and a drain of the second transistor 523 may be connected to the output node NOUT.

The first transistor 521 may be turned on and operated in response to the first control signal 511 from the controller 510, and the second transistor 523 may be turned on and operated in response to the second control signal 513 transmitted from the controller 510.

The first switch 511a of FIG. 8 may be implemented by a plurality of third transistors MP17, MP18, MN19, and MN20 shown in FIG. 9. When the first transistor 521 is turned on in response to the first control signal 511, the plurality of third transistors MP17, MP18, MN19, and MN20 are turned on, so that a current-mirrored constant current may be supplied to the cascode folding node "b" of the input terminal 531 just like the first switch 511a of FIG. 8 is turned on.

Also, the second switch 513a of FIG. 8 may be implemented by a plurality of fourth transistors MP15, MP16, MN17, and MN18 shown in FIG. 9. When the second transistor 523 is turned on in response to the second control signal 513, the plurality of fourth transistors MP15, MP16, MN17, and MN18 are turned on, so that a current-mirrored constant current may be supplied to the cascode folding node "a" of the input terminal 531 just like the second switch 513a of FIG. 8 is turned on.

Here, the magnitudes of the first control signal 511 and the second control signal 513 input from the controller 510 may be the first power voltage VDD or the second power voltage VSS. Accordingly, a voltage between the gate and the source of the first transistor 521 or the second transistor 523 may be the first power voltage-second power voltage (VDD-VSS). For example, if the first power voltage is 7 V and the second power voltage is 0 V, the voltage between the gate and the source of the first transistor 521 or the second transistor 523 may be 7 V. On the other hand, according to the conventional method, the voltage between the gate and the source may be maximally 3 V because the voltage between the gate and the source is determined by a difference between the output voltage VOUT and the input voltage VIN. Accordingly, since a higher voltage between the gate and the source is formed by the method proposed in the present disclosure, a larger current may be provided or may be sunk.

Figure 10:
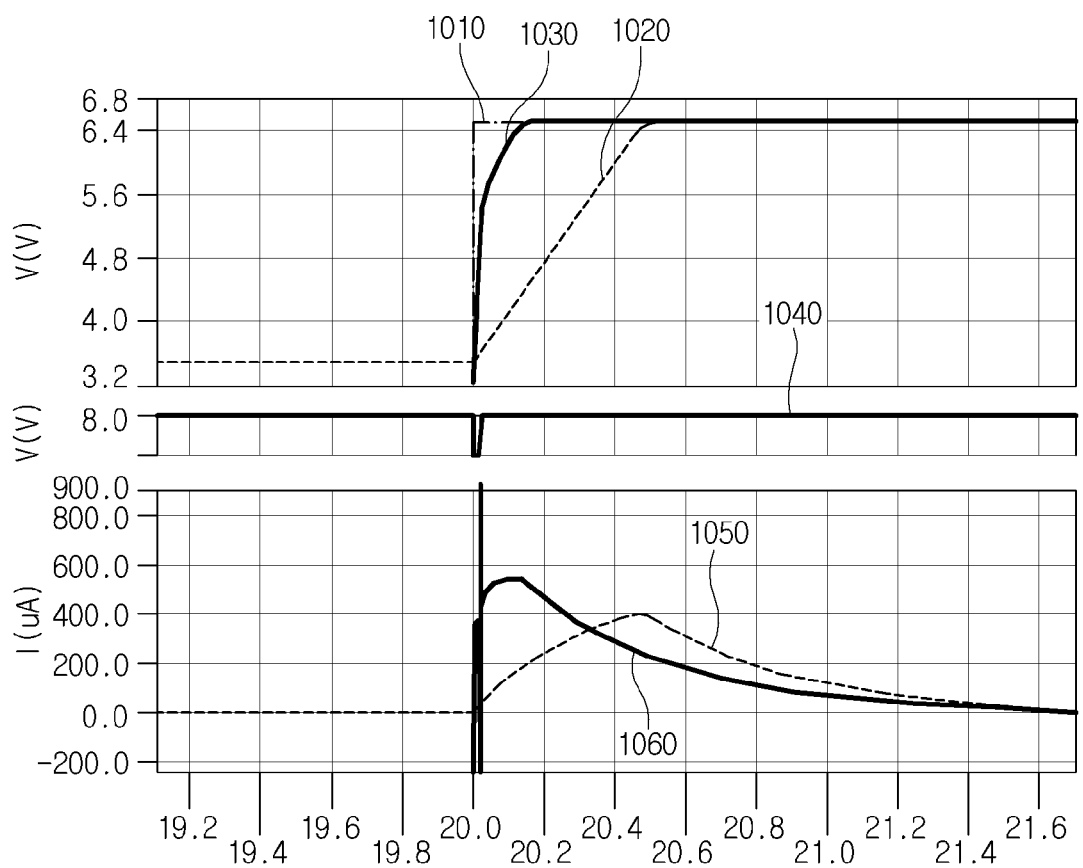
FIG. 10 is a graph of an output voltage and an output current according to whether to apply a slew rate improvement method proposed in the present disclosure.

FIG. 10 is a graph of the output voltage and the output current according to whether to apply a slew rate improvement method proposed in the present disclosure.

Referring to FIG. 10, the top three graphs show an input voltage 1010, an output voltage 1020 when the slew rate improvement method is not applied, and an output voltage 1030 when the slew rate improvement method is applied. A middle graph 1040 shows the first control signal 511 generated by the controller 510. The lower two graphs show a current 1050 when the slew rate improvement method is not applied and a current 1060 when the slew rate improvement method is applied, respectively.

Referring to FIG. 10, at a point of time when the input voltage is changed, the controller 510 may generate and transmit a control signal for operating the slew rate improvement circuit 520. As a result of this, it can be seen that when the slew rate improvement method is not applied, the slew rate is low, as shown in the graph 1020, whereas when the slew rate improvement method is applied, the slew rate is high, as shown in the graph 1030 and converges very quickly to the input voltage 1010.

However, when the slew rate improvement method is applied, the maximum value of a load charging current increases, as shown in the graph 1060, but an average current in a measurement interval may be similar. Thus, average power consumption may be similar.

Figure 11:
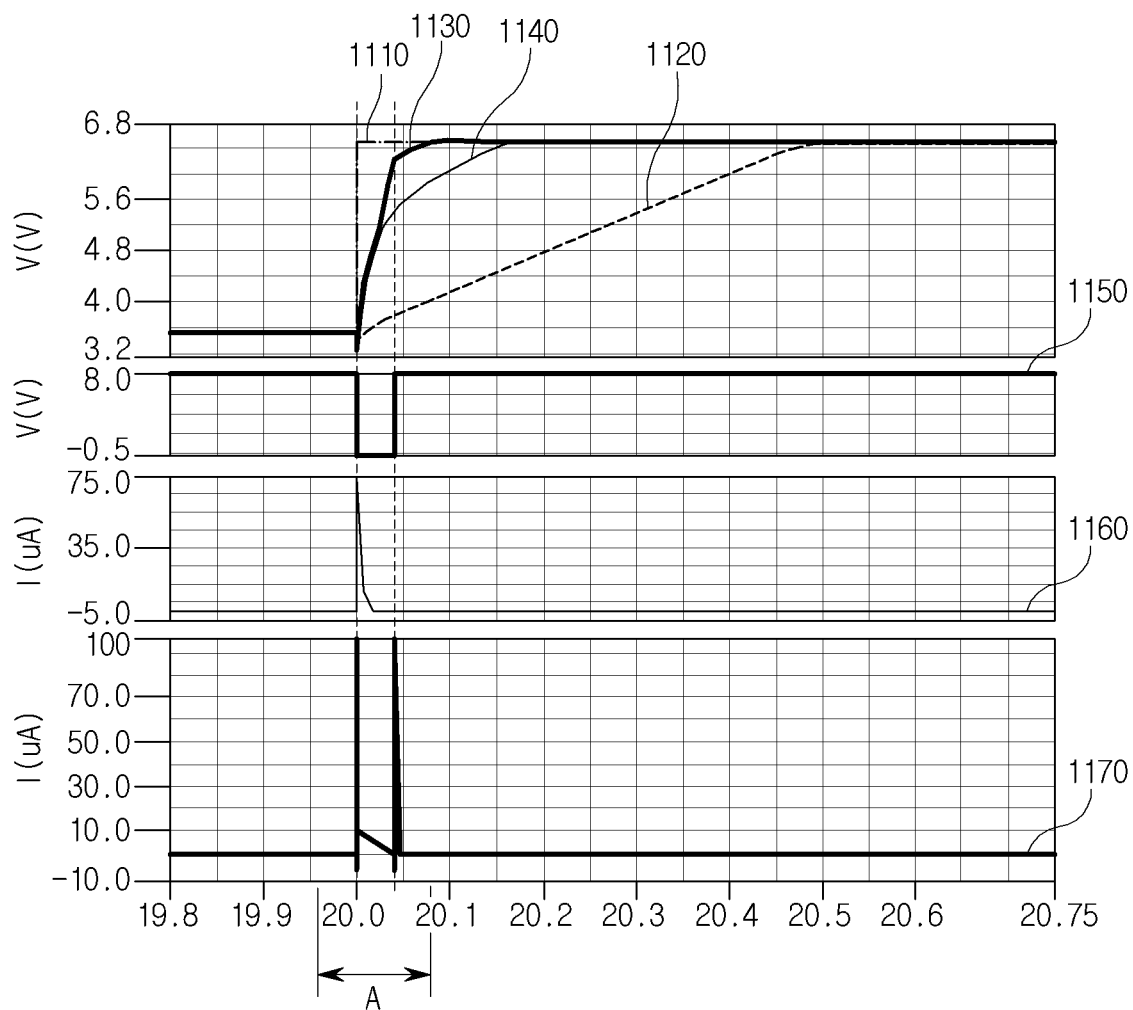
FIG. 11 is a view showing a graph of the output voltage and the output current when there is no slew rate improving circuit, a graph of the output voltage and the output current when there is a conventional slew rate improving circuit based on a difference between the input voltage and the output voltage, a graph of the output voltage and the output current when the slew rate improvement method proposed in the present disclosure is applied.

FIG. 11 is a view showing a graph of the output voltage and the output current when there is no slew rate improving circuit, a graph of the output voltage and the output current when there is a conventional slew rate improving circuit based on a difference between the input voltage and the output voltage, a graph of the output voltage and the output current when the slew rate improvement method proposed in the present disclosure is applied.

Referring to FIG. 11, top three graphs show an input voltage 1110, an output voltage 1120 when there is no slew rate improvement circuit, an output voltage 1140 when there is a conventional slew rate improvement circuit based on the difference between the input voltage and the output voltage, and an output voltage 1130 when the slew rate improvement method proposed in the present disclosure is applied. Referring to this comparison graph, it can be confirmed that when the slew rate improvement method proposed in the present disclosure is applied, the output voltage follows the input voltage 1110 earliest.

In FIG. 11, a graph 1150 shows the first control signal 511 generated by the controller 510. Due to the difference between the input voltage and the output voltage, the size of the control signal used in the conventional method decreases as the output voltage increases, so that the magnitude of the supplied current may decrease. On the other hand, in the present disclosure, since the controller 510 generates the control signal based on a code representing the input voltage, the control signal has a constant value, as shown in the graph 1150. As a result, when comparing a current graph 1160 according to the conventional method and a current graph 1170 according to the method proposed in the present disclosure, it can be seen that the method proposed in the present disclosure provides more current.

Figure 12:
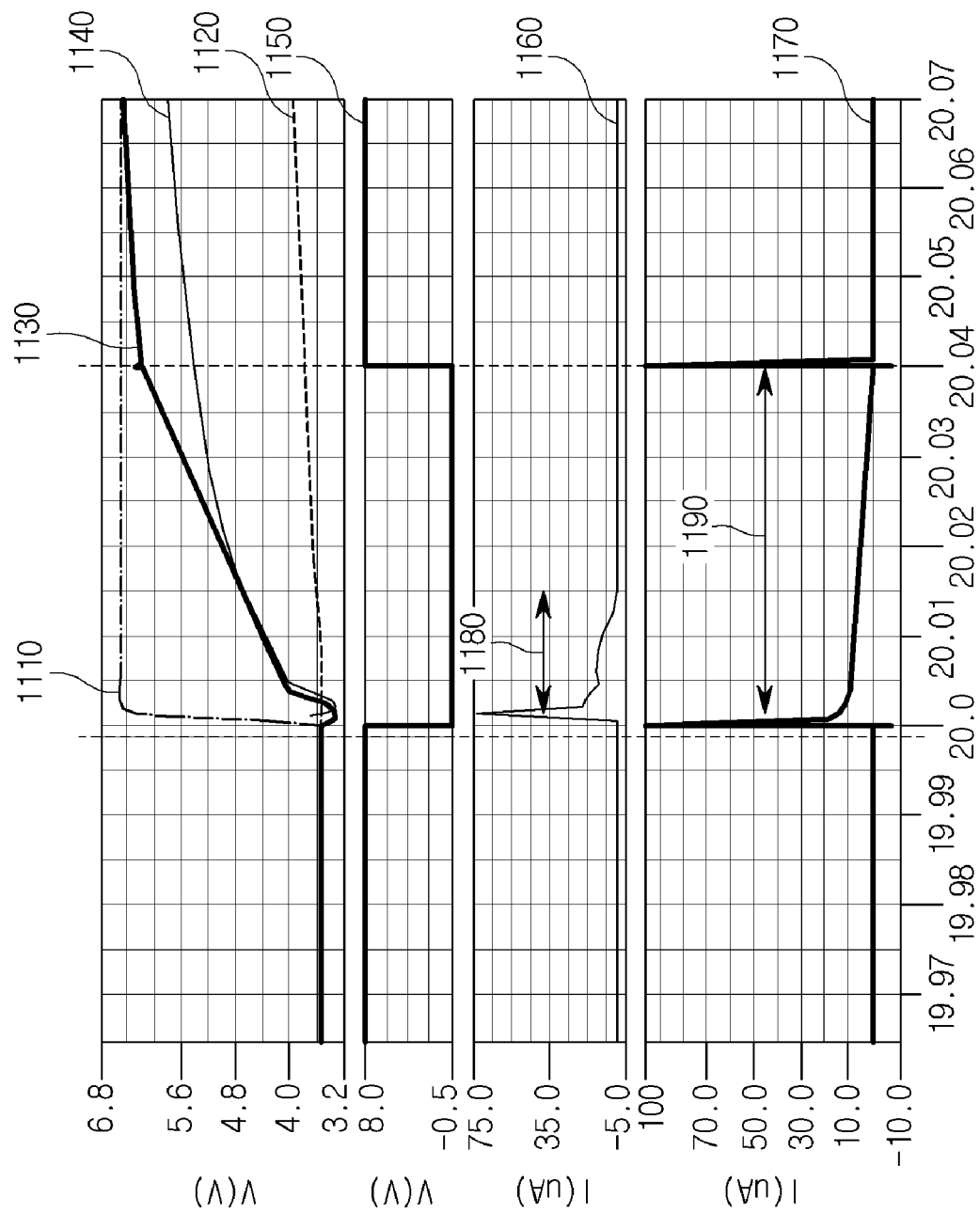
FIG. 12 shows an enlargement of a part of "A" in FIG. 11.

FIG. 12 shows an enlargement of a part of "A" in FIG. 11.

Referring to FIG. 12, in the conventional slew rate improvement circuit based on the difference between the input voltage and the output voltage operates only in an interval 1180 in which the difference between the input voltage and the output voltage is greater than the threshold voltage, whereas the method proposed in the present disclosure the slew rate improvement circuit can operate only during a time interval 1190 set by the controller 510. Accordingly, in the initial interval 1180 in which the slew rate improvement circuit operates in both methods, the slew rate improvement circuit has an almost similar slew rate. However, in the latter part of the time interval in which the slew rate improvement circuit operates only by the method proposed in the present disclosure, it can be seen that a higher slew rate is obtained by the method proposed in the present disclosure. As a result, it can be seen that the method proposed in the present disclosure has a higher slew rate overall.

Also, when comparing the graph 1160 of the conventional method and the graph 1170 according to the method proposed in the present disclosure, the slew rate improvement circuit of the conventional method starts operations from a point of time when the difference between the input voltage and the output voltage becomes greater than the threshold voltage. However, according to the method proposed in the present disclosure, since the controller 510 is aware in advance of the code corresponding to the input voltage input to the driving amplifier 135, an interval to operate the slew rate improvement circuit can be set in advance. That is, the execution command generated by the controller 510 may be generated before the input voltage of the driving amplifier 135 is supplied. Accordingly, the controller 510 can operate the slew rate improvement circuit 520 at a moment when the input voltage 1110 is input to the driving amplifier 135, thereby improving the slew rate more quickly.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A device for increasing a slew rate of a driving amplifier, the device comprising:
   a driving amplifier configured to amplify an input voltage and output an output voltage;
   a slew rate improvement circuit configured to provide a current to an output node of the driving amplifier or receive a current from the output node of the driving amplifier so as to increase the slew rate of the driving amplifier; and
   a controller configured to control an operation of the slew rate improvement circuit based on a difference between a first code corresponding to the input voltage of the driving amplifier during a current horizontal line time and a second code corresponding to the input voltage during a next horizontal line time,
   wherein the slew rate improvement circuit comprises:
   a first transistor disposed between a first power voltage and the output node of the driving amplifier, and configured to supply an additional current to the output node in response to a first control signal; and
   a second transistor disposed between the output node and a second power voltage, and configured to receive an additional current from the output node in response to a second control signal.

2. The device of claim 1, wherein the controller is further configured to set a threshold code and control the operation of the slew rate improvement circuit based on a result of a comparison of the threshold code and the difference between the first code and the second code.

3. The device of claim 2, wherein the controller is further configured to
   set a first threshold code with a positive value and a second threshold code with a negative value,
   generate a first execution command for controlling the slew rate improvement circuit to supply a current when a value obtained by subtracting the first code from the second code is greater than a value of the first threshold code, and generate a second execution command for controlling the slew rate improvement circuit to receive a current when the value obtained by subtracting the first code from the second code is less than a value of the second threshold code.

4. The device of claim 3, wherein the first execution command and the second execution command are generated before the input voltage is supplied to the driving amplifier.

5. The device of claim 3, wherein the first execution command and the second execution command operate the slew rate improvement circuit at a point of time when the input voltage of the driving amplifier is changed.

6. The device of claim 3, wherein the controller is further configured to:

determine time information on which the slew rate improvement circuit should operate, based on a magnitude of the value obtained by subtracting the first code from the second code, generate the first control signal for controlling the slew rate improvement circuit based on the generated first execution command and the determined time information, and generate the second control signal for controlling the slew rate improvement circuit based on the generated second execution command and the determined time information.

7. The device of claim 1, wherein the first transistor of the slew rate improvement circuit is a P-type transistor, and the second transistor is an N-type transistor.

8. The device of claim 7, wherein a source terminal of the first transistor is connected to the first power voltage, a drain terminal of the first transistor is connected to the output node of the driving amplifier, and a gate terminal of the first transistor receives the first control signal, and wherein a source terminal of the second transistor is connected to the second power voltage, a drain terminal of the second transistor is connected to the output node of the driving amplifier, and a gate terminal of the second transistor receives the second control signal.

9. The device of claim 7, wherein the slew rate improvement circuit further comprises:

a plurality of third transistors configured to allow a portion of the current to flow out from the inside of the driving amplifier to the second power voltage when the first transistor is turned on based on the first control signal; and a plurality of fourth transistors configured to supply a current internally to the driving amplifier from the first power voltage when the second transistor is turned on based on the second control signal.

10. A display device comprising:

a gate driver configured to sequentially provide a gate-on signal to a plurality of gate lines in response to a gate control signal;

a source driver configured to, in response to a data control signal, convert digital image data into analog image signals and provide the converted image signals to a plurality of data lines;

a display panel comprising a plurality of sub-pixels provided at intersections of the plurality of gate lines and the plurality of data lines; and a timing controller configured to externally receive a video image data, generate the digital image data, provide the generated digital image data to the source driver, and generate the gate control signal and the data control signal, wherein the source driver comprises:

a data latch configured to latch the digital image data received from the timing controller;

a digital-to-analog converter (DAC) configured to convert the latched digital image data to an analog signal; and a driving amplifier configured to amplify the analog signal outputted from the DAC and provide the amplified analog signal to the plurality of data lines, and wherein the driving amplifier comprises a slew rate improvement circuit connected to an output node of the driving amplifier and configured to increase a slew rate based on the digital image data corresponding to the analog signal displayed on the plurality of sub-pixels during a horizontal line time, and wherein the slew rate improvement circuit comprises:

a first transistor disposed between a first power voltage and the output node of the driving amplifier, and configured to supply an additional current to the output node in response to a first control signal; and a second transistor disposed between the output node and a second power voltage, and configured to receive an additional current from the output node in response to a second control signal.

11. The display device of claim 10, wherein the source driver further comprises a controller configured to set a threshold code value and control an operation of the slew rate improvement circuit based on a result of a comparison of the threshold code value with a difference value between a first code of the digital image data corresponding to an input voltage of the driving amplifier, during a current horizontal line time, and a second code that is the digital image data corresponding to an input voltage of the driving amplifier, during a next horizontal line time.

12. The display device of claim 10, wherein the timing controller further comprises a controller configured to set a threshold code value and control an operation of the slew rate improvement circuit based on a result of a comparison of the threshold code value with a difference value between a first code of the digital image data corresponding to an input voltage of the driving amplifier, during a current horizontal line time, and a second code of the digital image data corresponding to an input voltage of the driving amplifier, during the next horizontal line time.

13. The display device of claim 11, wherein the controller is further configured to:

set a first threshold code with a positive value and a second threshold code with a negative value, generate a first execution command to control the slew rate improvement circuit to supply a current when a value obtained by subtracting the first code from the second code is greater than a value of the first threshold code, and generate a second execution command to control the slew rate improvement circuit to receive a current when the value obtained by subtracting the first code from the second code is less than a value of the second threshold code.

14. The display device of claim 13, wherein the controller is further configured to generate the first execution command and the second execution command before the input voltage of the driving amplifier is supplied to the driving amplifier.

15. The display device of claim 13, wherein the first execution command and the second execution command operate the slew rate improvement circuit at a point of time when an input voltage of the driving amplifier is changed.

16. The display device of claim 13, wherein the controller is further configured to:
    determine time information on which the slew rate improvement circuit should operate, based on a magnitude of the value obtained by subtracting the first code from the second code,
    generate the first control signal for controlling the slew rate improvement circuit based on the generated first execution command and the determined time information, and
    generate the second control signal for controlling the slew rate improvement circuit based on the generated second execution command and the determined time information.

17. The display device of claim 12, wherein the controller is further configured to:
    set a first threshold code with a positive value and a second threshold code with a negative value,
    generate a first execution command to control the slew rate improvement circuit to supply a current when a value obtained by subtracting the first code from the second code is greater than a value of the first threshold code, and
    generate a second execution command to control the slew rate improvement circuit to receive a current when the value obtained by subtracting the first code from the second code is less than a value of the second threshold code.

18. The display device of claim 17, wherein the controller is further configured to generate the first execution command and the second execution command before the input voltage of the driving amplifier is supplied to the driving amplifier.

19. The display device of claim 17, wherein the first execution command and the second execution command operate the slew rate improvement circuit at a point of time when an input voltage of the driving amplifier is changed.

20. The display device of claim 17, wherein the controller is further configured to:
    determine time information on which the slew rate improvement circuit should operate, based on a magnitude of the value obtained by subtracting the first code from the second code,
    generate a first control signal for controlling the slew rate improvement circuit based on the generated first execution command and the determined time information, and
    generate a second control signal for controlling the slew rate improvement circuit based on the generated second execution command and the determined time information.

21. A method for increasing a slew rate of a driving amplifier in a display device comprising a slew rate improvement circuit and a controller, the method comprising:
    setting, by the controller, a first threshold code with a positive value and a second threshold code with a negative value;
    obtaining, by the controller, a first code of a digital image data corresponding to an input voltage of the driving amplifier, during a current horizontal line time, and a second code of a digital image data corresponding to an input voltage of the driving amplifier, during a next horizontal line time;
    generating, by the controller, a slew rate improvement circuit execution command based on a result of a comparison between a value of the threshold code and a difference between a value of the second code and a value of the first code, which comprises:
        generating a first execution command when a value obtained by subtracting the first code from the second code is greater than the first threshold code; and
        generating a second execution command when a value obtained by subtracting the first code from the second code is less than the second threshold code;
    generating, by the controller, information required for an operation of the slew rate improvement circuit in response to the generated execution command; and
    generating, by the controller, a control signal to operate the slew rate improvement circuit based on the generated information,
    wherein the slew rate improvement circuit is configured to provide a current to an output node of the driving amplifier or receive a current from the output node of the driving amplifier, according to the control signal, so as to increase the slew rate of the driving amplifier.

22. The method of claim 21, wherein the generating of the information required for the operation of the slew rate improvement circuit comprises determining time information on which the slew rate improvement circuit should operate, based on a magnitude of the value obtained by subtracting the first code from the second code.

23. The method of claim 22, wherein the generating of the control signal to operate the slew rate improvement circuit based on the generated information comprises:
    generating a first control signal for controlling the slew rate improvement circuit to supply a current to an output terminal of the driving amplifier, based on the generated first execution command and the determined time information; and
    generating a second control signal for controlling the slew rate improvement circuit to receive a current from the output terminal of the driving amplifier, based on the generated second execution command and the determined time information.

* * * * *